United States Patent
Van Den Wildenberg (10) Patent No.: US 7,173,685 B2
(45) Date of Patent: Feb. 6, 2007

(54) LITHOGRAPHIC APPARATUS, A DEVICE MANUFACTURING METHOD, AND A FASTENER FOR USE IN A LITHOGRAPHIC APPARATUS

(75) Inventor: Lambertus Adrianus Van Den Wildenberg, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 184 days.

(21) Appl. No.: 10/878,624

(22) Filed: Jun. 29, 2004

(65) Prior Publication Data

US 2005/0286040 A1   Dec. 29, 2005

(51) Int. Cl.
G03B 27/42   (2006.01)
G03B 27/58   (2006.01)

(52) U.S. Cl. .......................................... 355/53; 355/72
(58) Field of Classification Search ................... 355/53, 355/72–76; 411/132–134, 149–150
See application file for complete search history.

(56) References Cited

U.S. PATENT DOCUMENTS

| | | | | |
|---|---|---|---|---|
| 5,207,544 | A * | 5/1993 | Yamamoto et al. | 411/348 |
| H1588 | H * | 9/1996 | Arney | 343/715 |
| 6,019,556 | A * | 2/2000 | Hess | 411/134 |
| 6,318,939 | B1 * | 11/2001 | Avaux | 411/153 |
| 6,878,042 | B2 * | 4/2005 | Oshino | 451/41 |

* cited by examiner

*Primary Examiner*—Henry Hung Nguyen
(74) *Attorney, Agent, or Firm*—Pillsbury Winthrop Shaw Pittman LLP (57) ABSTRACT

A lithographic apparatus is disclosed. The apparatus includes an illumination system for conditioning a beam of radiation, and a support structure for supporting a patterning device. The patterning device serves to impart the beam of radiation with a pattern in its cross-section. The apparatus also includes a substrate table for holding a substrate, a projection system for projecting the patterned beam onto a target portion of the substrate, and a fastener for fastening a first part of the apparatus to a second part of the apparatus. The fastener includes at least one integrated spring.

34 Claims, 6 Drawing Sheets

LITHOGRAPHIC APPARATUS, A DEVICE MANUFACTURING METHOD, AND A FASTENER FOR USE IN A LITHOGRAPHIC APPARATUS

FIELD

The present invention relates to a lithographic apparatus, a vacuum apparatus, a device manufacturing method, and a device manufactured thereby. More specifically, the invention relates to a fastener for fastening a first part of the apparatus to a second part of the apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or antiparallel to this direction.

In the lithographic apparatus, various parts are fastened to one another using fasteners. It is known, for example, to use bolt, screw or stud fasteners for fastening apparatus parts together. For example, a first apparatus part, such as an optical component, may be clamped onto a second apparatus part, such as a base or a support frame, using one or more fasteners.

The known fastener, e.g. a bolt, screw, or stud, includes a shaft that has screw thread of a certain pitch, as well as a driving head for driving the fastener into a suitable aperture of a respective apparatus part. After assembly, the fastener clamps the apparatus parts together, using cooperation of the screw thread of the shaft and the screw aperture, and the driving head.

Generally, it is desired to provide a relatively firm clamp so that the apparatus parts can be connected to each other firmly and durably. It is known to provide such a firm clamp by using a certain spring tension. This spring tension can be provided by a certain elasticity of the apparatus parts which are to be clamped together. However, in many cases, the apparatus parts may not be suitable to provide or sustain such elasticity. Also, in various cases, deformation of one or more of the apparatus parts may not be desired, for example, because such deformation may result in misalignment of the apparatus part.

The material of each fastener as such may have a certain elasticity which can result in a certain spring tension after the fastener has been mounted. For example, the free length of the screw may be allowed to stretch for providing a certain clamping tension. However, in many cases, a certain attainable free length of the screw (or bolt or stud), a certain desired clamping force, a certain allowable torque, a certain relaxation reserve and/or a desired diameter cannot be designed or selected satisfyingly. For example, in certain cases, the free length of the fastener has to be so large for providing sufficient tension after assembly that there is insufficient space left in the apparatus for mounting the fastener.

Moreover, it is known to use a separate spring or spring washer, which is placed between the head of the fastener and an apparatus part, for securing a certain clamping tension after assembly. However, the application of such separate, usually relatively small, spring parts or washers is not desired for production and service, because such part or washers can easily be dropped and lost in the apparatus during assembly. Small spring parts or washers are relatively difficult to handle and may therefore lead to assembly difficulties or delays.

If the fastener is to be used in or in contact with a vacuum environment, it is desirable mount the fastener in a way to prevent dead volumes, where residual gasses can be trapped for a certain period of time. Such dead volumes may hamper the pumping down of the apparatus. Also, gasses escaping from such dead volumes may contaminate the desired vacuum. Special holes may be drilled in apparatus parts to prevent or remove such dead volumes. However, drilling holes in apparatus parts is costly and may negatively affect the functioning of the apparatus parts. An axial hole may be provided in the stud, screw or bolt fastener for opening any dead volume which may lie axially below the fastener. However such axial holes can not reach all dead volumes which may be trapped by the fastener after assembly.

The disadvantages of known fasteners and fastening methods of apparatus parts may reduce overall apparatus performance, lessen throughput and decrease the operating accuracy of the apparatus. This leads to higher costs and/or lower performance of devices, which are made by the apparatus using a lithographic manufacturing method.

SUMMARY

It is an aspect of the present invention to provide a lithographic apparatus that includes improved fasteners for joining apparatus parts.

It is an aspect of the invention to provide a lithographic apparatus in which apparatus parts can be clamped together using one or more relatively simple fasteners.

It is an aspect to provide a lithographic apparatus in which dead volumes, which are trapped between fasteners and apparatus parts, may be prevented.

It is an aspect to provide relatively inexpensive, high performance devices, made by a lithographic apparatus and/or a lithographic manufacturing method.

It is an aspect to provide a vacuum apparatus that includes improved fasteners for joining apparatus parts.

According to an aspect of the invention, a lithographic apparatus is provided. The apparatus includes an illumination system for conditioning a beam of radiation and a support structure for supporting a patterning device. The patterning device serves to impart the beam of radiation with a pattern in its cross-section. The apparatus also includes a substrate table for holding a substrate, a projection system for projecting the patterned beam onto a target portion of the substrate, and at least one fastener for fastening a first part of the apparatus to a second part of the apparatus. The fastener includes at least one integrated spring.

The integrated spring may secure and/or maintain a certain clamping force after assembly, for clamping the first and second apparatus part together. Since the spring is an integrated spring, the use of separate springs or separate spring washers may be avoided. Thus, the fastening of apparatus parts may be achieved straight-forwardly and safely. The apparatus parts as such do not have to provide a clamping spring force. Therefore, the apparatus parts may be relatively rigid. Also, the fastener, e.g. screw, bolt or stud, may be made relatively short in the axial direction while still being able to secure and/or maintain a suitable pretension, because the fastener includes one or more integrated springs.

The application of the fastener, including the integrated spring, may lead to an improvement of overall apparatus performance, a higher throughput, shorter downtimes and/or a better operating accuracy of the apparatus. This may further lead to lower costs and/or higher performance of devices, made by the apparatus using a lithographic manufacturing method.

The integrated spring may be manufactured in various ways. The spring may, for example, simply be machined into the fastener. The machining may involve, for example, cutting the spring into the shaft of the stud, bolt or screw fastener, as will be described below.

According to an embodiment of the invention, the spring is a helical part of the fastener. Such a helical spring part can provide desired, suitable spring forces to clamp the apparatus parts together. The helical spring part may be designed for use in certain specific applications. Various parameters of the spring may be chosen or tuned to achieve a desired clamping. Such parameters may include, for example, the pitch of the helix, the number of turns, the diameter of the helix, and the-like. Depending on such parameters, a relatively short helical part of the fastener, when measured in an axial direction of the fastener, may provide a suitable clamping force for the clamping of apparatus parts.

The helical spring part of the fastener may be able to prevent the presence of dead volumes, which may be trapped between the fastener and one or more apparatus parts. To this aim, the fastener may further include an axial hole, for example, a through-hole.

During use, the first and second apparatus parts can be connected to each other by the fastener. Any space which is caught between the outer surface of the helical part of the fastener and any opposite surface of an apparatus part can be reached via the fastener, i.e., via openings of the helical part of the fastener and via the axial hole. Such enclosed space can simply be pumped down via the openings of the fastener, when the fastener is in fluid communication with a vacuum environment. This may also lead to better apparatus performance, lower down-times, a cleaner vacuum environment for manufacturing devices and, thus, improved and/or less expensive devices.

According to an aspect of the invention, the helical part has a turn suitable for providing a self-locking function during assembly. To this aim, the direction of the pitch of the helical part is opposite to the direction of the pitch of screw thread of the fastener.

For example, in case the fastener includes a normal right wound screw thread, when looking from an upper fastener end down in axial direction, one will apply a clockwise torque to the fastener during mounting. Then, the fastener may be simply turned in clockwise direction for connecting apparatus parts. This may cause a tendency to decrease the diameter and pitch or length of the helical part. An accumulated torsion or torsional force in the helix may then tend to drive a lower fastener part in even deeper. After assembly, any turn in the opposite direction may result in a expansion of the diameter of the helical part. Therefore, the fastener is simply locked in the respective apparatus part after assembly.

According to an aspect of the invention, a vacuum apparatus is provided. The apparatus includes at least one fastener, e.g. stud, bolt or screw, for fastening a first part of the apparatus to a second part of the apparatus. The fastener includes at least one integrated spring. This may provide the abovementioned advantages to the vacuum apparatus. Particularly, the fastener may provide a relatively firm fastening of apparatus parts. Presence of dead volumes may be prevented better by using the fastener, particularly when the fastener includes a helical spring part. The vacuum apparatus may be any vacuum apparatus, for example, a semiconductor industry vacuum apparatus, lithographic vacuum apparatus, deposition apparatus, analyzer, medical tool, microscope, an apparatus to be used in space, a space craft or part thereof, and/or the-like.

In an aspect of the invention, a lithographic apparatus is provided. The apparatus includes an illumination system for conditioning a beam of radiation, and a support structure for supporting a patterning device. The patterning device serves to impart the projection beam with a pattern in its cross-section. The apparatus also includes a substrate table for holding a substrate, and a projection system for projecting the patterned beam onto a target portion of the substrate. At least a first apparatus part is located in a vacuum environment of the apparatus. The apparatus also includes at least one fastener, e.g. a stud, bolt or screw, for fastening the first part of the apparatus to a second part of the apparatus. The fastener includes an integral helical spring which extends between a head of the fastener and a screw thread part of a shaft of the fastener.

Such fasteners may provide a desired clamping force, wherein the presence of dead volumes can be prevented relatively well. The fastener may be manufactured relatively easy, for example, by cutting a helical part out of a shaft of the fastener.

According to an aspect of the invention, a device manufacturing method, utilizing a lithographic apparatus, is provided. The method includes: providing a substrate; providing a beam of radiation using an illumination system; using a patterning device to impart the beam of radiation with a pattern in its cross-section; and projecting the patterned beam of radiation onto a target portion of the substrate. At least one bolt, screw or stud is used as a fastener to fasten a first part of the apparatus to a second part of the apparatus. The fastener includes at least one integrated spring, for example, a helical spring part and/or an integrated spring which is provided by a number of apertures extending between an outer circumference of the fastener and an internal hole, for example, an axial hole, thereof.

In one embodiment, gas is pumped from between the fastener and the first and/or second apparatus part via at least one opening extending through the fastener, so that contamination of a processing space of the apparatus may be prevented or reduced. For example, the integrated spring may extend between a threaded shaft part of the fastener and a head part of the fastener, such that gas is pumped from an outer circumferential side of the integrated spring, via at least one opening of the spring to an axial hole of the fastener.

As has been mentioned above, the helical part may have a turn suitable for providing a self-locking function during assembly, wherein the direction of the pitch of the helical part is opposite to the direction of the pitch of screw thread of the fastener. Then, when the fastener includes an axial hole, for example, a through-hole, a tightening element may be inserted in the axial hole of the fastener, for preventing a radial contraction of the fastener during the mounting thereof and increasing an allowed mounting torque applied to the fastener.

An embodiment provides the use of an apparatus in the manufacturing of devices, which may lead to the abovementioned advantages.

An embodiment provides a device manufactured by an aforementioned apparatus and/or by an aforementioned method so that the device may be provided relatively inexpensively, and have a relatively high performance during operation.

An embodiment provides a method for manufacturing a screw, bolt or stud fastener, having a shaft and a head. According an embodiment, the method is characterized by at least one cut-out which is machined into the shaft for providing a helical integral spring. This method leads to a fastener, which can advantageously used, for example, in a lithographic and/or vacuum apparatus for providing abovementioned advantages.

In an embodiment, part of the shaft is provided with screw thread. Such screw thread may have, for example, a left hand turn or a right hand turn. When the cut-out is a helical cut-out, and in case the direction of the pitch of the helical part is opposite to the fastening direction of the fastener, a self-locking function can simply be obtained.

In an embodiment, the cut-out extends between the head and the screw thread. Therefore, the spring part may spring the head of the fastener with respect to the screw thread part, for providing or securing a clamping force after assembly. In this way, the helix extends outside the threaded part of the fastener.

The cut-out may be made after the screw thread has been provided in the shaft. Thus, an existing screw, bolt or stud can simply be machined into a fastener according to the assembly.

Also, the cut-out may be machined in a part of the shaft which does not have screw thread. This leads to a fastener in which the spring part extends between the fastener head and the screw thread.

Also, as has been mentioned above, an axial hole may be provided into the shaft, for example, by drilling. The axial hole may complete the spring part, in combination with the cut-out. Such an axial hole may be used for preventing dead spaces during use of the fastener, and/or to insert a tool for assembly.

In an aspect of the invention, the shaft of the fastener is provided with a plurality of separate slits as well as an internal hole, such that the slits extend between an outer circumference of a shaft of the fastener and the internal hole, for example, an axial hole, thereof. A number of the slits are spaced apart, when viewed in an axial direction of the shaft of the fastener. For example, a number of the slits may be spaced apart, when viewed in an circumferential direction of the shaft of the fastener. Further, each slit may overlap, for example, at least one circumferential end of each axially nearest slit, when viewed in axial direction of the fastener shaft. Also, all of the slits together may overlap each other at least once over the whole circumference of the fastener shaft, when viewed in axial direction of the fastener shaft.

According to an aspect of the invention, a fastener is provided. The fastener may be a bolt, screw or stud, that has a shaft and a head. The fastener includes at least one integrated spring. Preferably, the spring is a helical part of the fastener. The fastener may also include an axial hole, for example, a through-hole. The fastener may include a removable tightening element which is arranged to be inserted in the axial hole of the fastener, during tightening of the fastener. The integrated spring may include one or more openings extending at least radially from the axial hole to the outer surface of the fastener. The direction of the pitch of the helical part may be opposite to the direction of the pitch of screw thread of the fastener, for example, to provide a self-locking function during assembly. Also, the direction of the pitch of the helical part may be the same as the direction of the pitch of screw thread of the fastener. Further, the spring may extend, for example, between the threaded shaft part and the head part. Such a fastener may be used in various applications for fastening various parts, components, elements, objects, and the like, durably and firmly to one another. Such a fastener may be used for preventing the presence of dead volumes after assembly. Also, the integrated spring may be provided by a number of apertures, for example, one or more apertures, extending between an outer circumference of the fastener and an internal hole, for example, an axial hole, thereof.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts.

DETAILED DESCRIPTION

Figure 1:
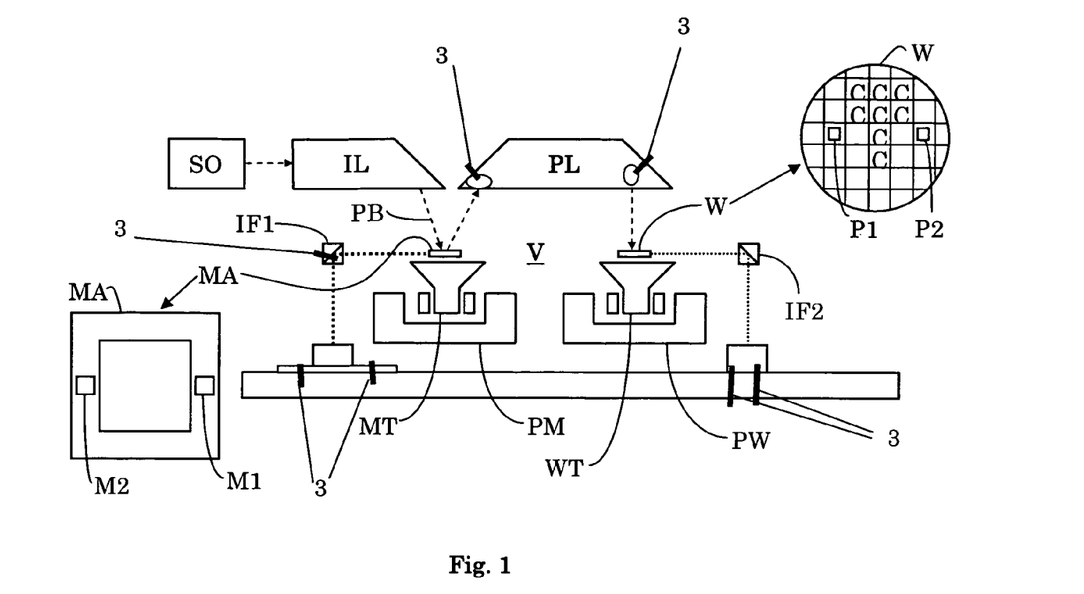
FIG. 1 depicts a lithographic apparatus according to an embodiment of the invention.

FIG. 1 schematically depicts an apparatus according to a particular embodiment of the invention. The apparatus may be, for example, a vacuum apparatus. In the present embodiment, the apparatus is a lithographic apparatus and includes an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

In the case where the apparatus is a vacuum apparatus, one or more components of the apparatus may be located in, or abut, a vacuum environment V. One or more vacuum pumps for maintaining this environment at a desired low pressure have not been shown in the figure. It is known how to utilize such vacuum pumps for achieving a desired pressure in the apparatus, if desired.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases, the source may be integral part of the apparatus, for example when the source is a mercury lamp. The source SO and the illuminator IL may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning)

and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

As shown in FIG. 1, the apparatus includes fasteners 3 for fastening various components of the apparatus. For example, the fasteners 3 may be utilized for fastening one or more optical elements, mirrors, lenses, wafer stage parts, mask stage parts, or detector parts of the apparatus. Such parts may, for example, be fastened to one or more frame parts, wall parts or base parts of the apparatus using the fasteners 3. Also, the apparatus may include one or mounting frames, holders, or the like for mounting optical elements, mirrors, lenses, wafer stage parts, mask stage parts, detector parts, or the like. One or more fasteners may also be used to fasten such mounting frames to other apparatus parts.

Figure 2:
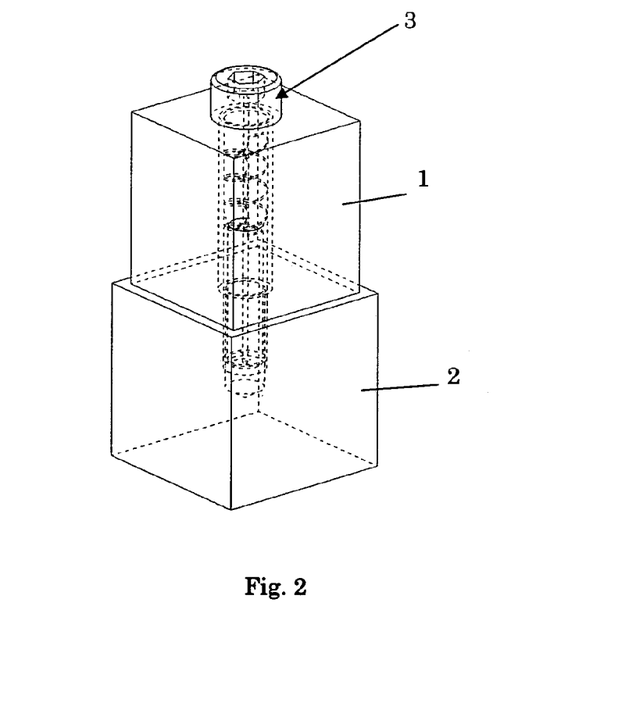
FIG. 2 is a perspective view of an assembly of a first apparatus part, a second apparatus part and a fastener of the apparatus of FIG. 1.
Figure 3:
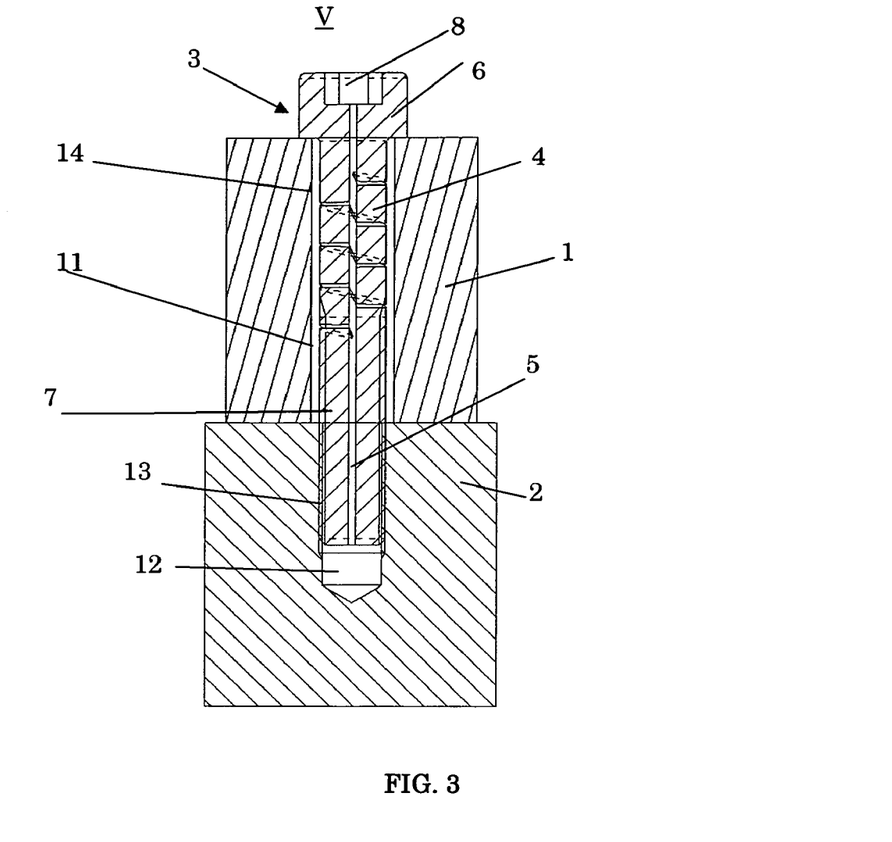
FIG. 3 is a cross-section of the assembly of FIG. 2.
Figure 4:
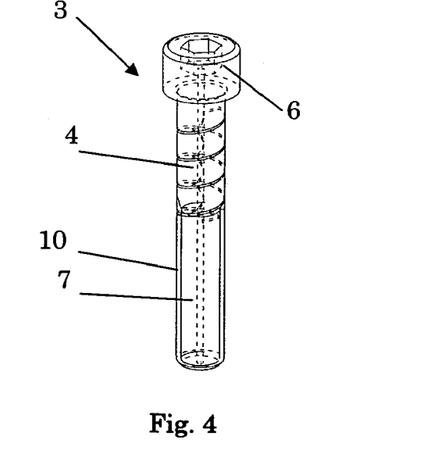
FIG. 4 is a perspective view of the fastener of the assembly of FIG. 2.
Figure 5:
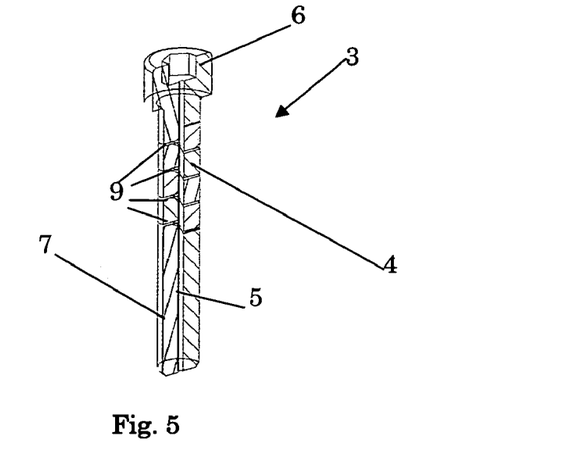
FIG. 5 is a longitudinal cross-section, in perspective view, of the fastener of FIG. 4.
Figure 6:
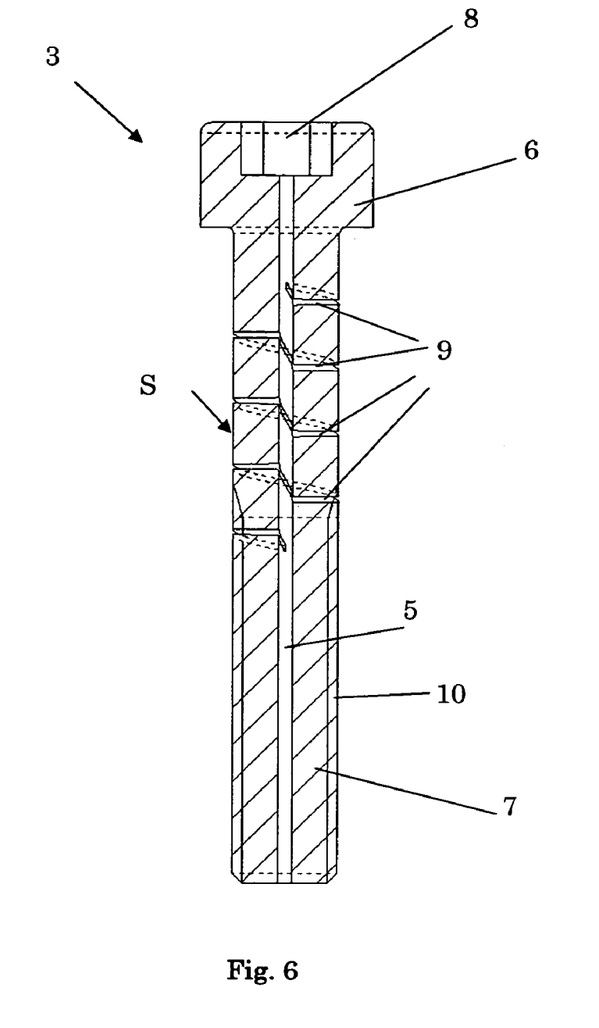
FIG. 6 is a longitudinal cross-section, in side view, of the fastener of FIG. 4.

FIGS. 2 and 3 schematically show part of the apparatus of FIG. 1. FIGS. 2 and 3 show a first apparatus part 1, a second apparatus part 2 and an embodiment of a fastener 3 for clamping the apparatus parts 1, 2 together. The first and second apparatus part 1, 2 may include, for example, one or more of the above-mentioned components of the apparatus.

The fastener 3 includes a head 6 and a substantially cylindrical shaft 7, extending perpendicularly from the head 6. The head 6 is wider than the shaft 7. After mounting, the shaft 7 of the fastener 3 extends through aligned apertures 11, 12 of the apparatus parts 1, 2. A portion of the fastener shaft 7 includes an outer screw thread 10 for cooperation with an inner screw thread 13 of the aperture 12 of the second apparatus part 2.

The head 6 of the fastener 3 includes an aperture 8 to be engaged by an appropriate driver. It is understood that the head 6 may have many different forms, shapes, apertures, and the like for cooperation with suitable driving tools.

In the present embodiment, the screw thread 10 of the fastener 3 is arranged for a counter-clockwise tightening during assembly. Alternatively, a clockwise tightening may be implemented, if desired.

As is shown in FIGS. 2–6, the fastener 3 includes one integrated spring 4. Alternatively, the fastener 3 may be provided with more than one integrated spring 4. As shown, the spring 4 does not intersect with the screw thread 10 of the fastener 3. The spring 4 extends between the threaded shaft part, having screw thread 10, and the fastener head 6. In the present embodiment, the spring 4 is a helical part of the fastener 3. The helical part extends, or twists, concentrically around the central axis of the fastener 3. Particularly, the fastener 3 includes a helical slit 9, which may have simply been cut out of the shaft 7 of the fastener 3 using suitable machining tools. Also, the fastener 3 may include an axial hole 5, which extends at least through the part of the fastener, including the helical slit 9. In the present embodiment, the hole 5 is a through-hole, extending between the opposite axial ends of the fastener. The helical slit 9 merges with the axial hole 5. The helical spring results from this combination of the helical slit 9 and the axial hole 5. The helical slit 9 also provides an opening, extending at least radially from the axial hole 5 to the cylindrical outer surface S of the fastener.

Figure 8:
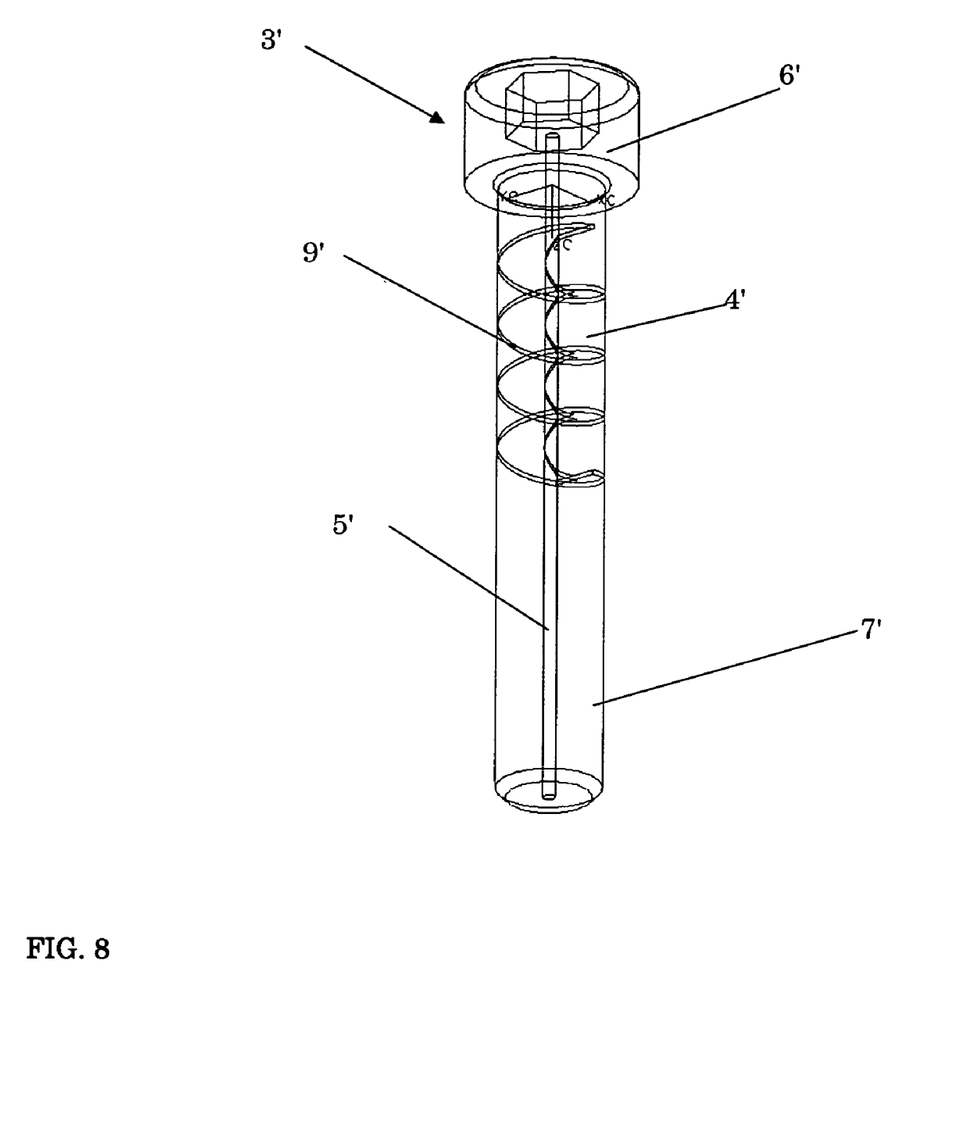
FIG. 8 is a perspective view of a fastener according to an embodiment.

In the present embodiment, the direction of the pitch of the helical spring part 4 is opposite to the direction of the pitch of the outer screw thread 10 of the fastener. This provides a self-locking function during assembly. In the present embodiment, for example, the helical spring part has a right hand -or clockwise- turn, viewed downwardly from the head of the fastener, and opposite to the counter-clockwise fastening direction of the fastener 3. FIG. 8 shows a second, alternative, embodiment of a fastener 3', that includes a helical spring part 4' having a counter-clockwise turn.

Figure 7:
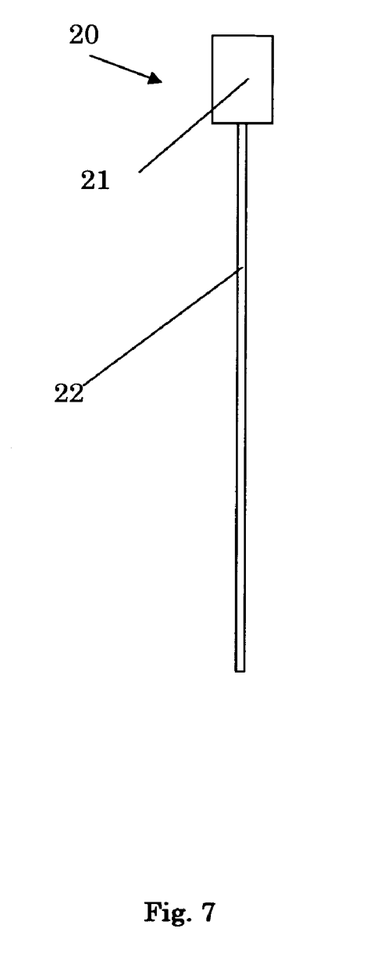
FIG. 7 is a side-view of a tightening element of the assembly of FIG. 2.

The apparatus may further include a tightening element 20, an example of which is schematically depicted in FIG. 7. The tightening element 20 is arranged to be inserted in the axial hole 5 of the fastener 3. The tightening element 20 includes a head 21 and a cylindrical rod 22. The rod 22 of the tightening element 20 is arranged to fit tightly in the hole 5 of the fastener 3. For example, the diameter of the rod 22 of the tightening element 20 may be substantially the same or only slightly smaller than the diameter of the through-hole 5 of the fastener 3. During use, the rod 22 of the tightening element 20 can be entered into the axial hole 5 of the fastener 3, to prevent contraction of the spring part 4 of the fastener 3 during assembly.

During use of the fastener 3, the first 1 and second apparatus part 2 are first positioned onto each other for aligning the respective apertures 11, 12. Then, the shaft 7 of the fastener 3 is inserted into these apertures 11, 12. The fastener 3 is screwed in the appropriate direction, so that the screw thread 10 of the fastener 3 winds into the screw thread 13 of the aperture 12 of the second apparatus part 2. After the fastener 3 has been screwed over a certain distance into the second apparatus part 2, the head of the fastener 3 will make contact with the surface of the first apparatus part 1. When the fastener 3 is screwed still further into the second apparatus part 2, the integral spring part 4 of the fastener 3 will elastically deform from a relaxed state into a certain tensioned state, resulting in the assembled configuration shown in FIGS. 2 and 3. In this assembled configuration, the integral spring part 4 of the fastener provides a certain tension for clamping the first apparatus part between the head 6 of the fastener 3 and the second apparatus part.

Various parameters of the spring part 4 determine, among others, the spring constant of that part 4, a maximum clamping force to be achieved by the fastener 3, and axial and torsional stiffness of the fastener 3. These parameters include, but are not limited to: the number of spring parts 4 of the fastener; various dimensions of the spring part 4, the outer and inner diameter of the spring part 4, the pitch of the helix, the cross-section of the helix, the number of turns of the helix, the material used in the spring part 4, the turning direction of the helix, the width of the helical slit 9, the diameter of the spring part 4 with respect to the diameter of the threaded part of the shaft 7, and the direction of the helix.

By tuning such parameters, the fastener 3 may be designed for providing optimum performance, depending on the application in which it is to be used. For example, the fastener 3 may be designed for providing a relatively large pretension, with the overall axial length of the fastener 3 being relatively small. The parameters of the fastener 3 may be tuned for providing an improved contact with the apparatus parts 1, 2. Such an improved contact may be attained, for example, by providing the fastener 3 with a relatively large relaxation reserve via the integrated helical spring part 4, because the head may be able to nudge and let its mounting surface align to the first apparatus part 1. For example, the spring part 4 of the fastener 3 may include a plurality of turns and/or starts. Also, the direction of the helix may be tuned for controlling the direction of torsional deformation, if desired.

Also, during assembly, the self-locking mechanism may be used for preventing unfastening of the apparatus parts 1, 2. In that case, when the tightening element 20 is used, radial contraction of the spring part 4 is hindered so that axial contraction is hindered as well. Such a tightening element 20 may be removed from the fastener 3 after the tightening element 20 has been used.

After assembly, the apparatus can be used in a device manufacturing method, particularly in case the apparatus is a lithographic apparatus as shown for example, in FIG. 1. The method includes providing a substrate W, providing a beam of radiation using an illumination system IL, using a patterning device MA to impart the beam of radiation with a pattern in its cross-section, and projecting the patterned beam of radiation onto a target portion of the substrate W.

This method has been described above with respect to FIG. 1. According to an embodiment, the method is characterized by at least one bolt, stud or screw being used as a fastener 3 to fasten a first part of the apparatus 1 to a second part 2 of the apparatus. The fastener 3 includes an integrated spring 4, for example, a helical spring part.

The fastener 3 may be used in an vacuum apparatus, for example, a vacuum lithography apparatus or a different apparatus. For example, the first apparatus part 1 may be located in a vacuum environment V of the apparatus. As has been depicted in FIG. 3, the surface of the first apparatus part 1, which surface is being held by the head 6 of the fastener 3, may abut, for example, a certain vacuum atmosphere V. In that case, the fastener head 6 also extends in the vacuum V so that the axial hole 5 of the fastener 3 is in fluid communication with the vacuum environment V.

As shown in FIG. 3, the fastener 3, the first apparatus part 1 and the second apparatus part 2 enclose a cylindrical space 14. This enclosed space 14 will contain one or more gasses after assembly, in case the environment of the apparatus parts 1, 2 has not been pumped down to a desired vacuum pressure yet. The fastener 3 and the second apparatus part 2 further enclose a bottom part of the aperture 12 of second apparatus part 2.

After assembly, the environment near the fastener head 6 and first apparatus part 1 is pumped down to a desired vacuum pressure. Under influence of the reduced pressure, residual gas may flow from the outer circumferential side of the integrated spring and via the helical slit 9 to the axial opening 5 of the fastener 3. The gas exits the axial opening 5 via the head 6 of the fastener 3, into the adjoining space. In this way, the enclosed cylindrical space 14 is prevented from becoming a dead volume. Also, the bottom part of the aperture 12 of second apparatus part 2 can be pumped down via the axial hole 5 of the fastener 3. Thus, the presence of dead volumes may be reduced significantly by the fastener 3, leading to relatively fast pump-down times and a reduction of contamination of the apparatus.

In the described embodiment, one axial end of the fastener 3 abuts the vacuum environment V after assembly. Alternatively, for example, in case the aperture 12 of the second apparatus 2 part is in fluid communication with vacuum, both axial ends of the fastener 3 may be in fluid communication with an vacuum environment for reaching enclosed volumes. Also, in an alternative embodiment, the axial hole 5 of the fastener may not extend through the head 6 thereof, but only through the opposite fastener end, to be in fluid communication with a vacuum via the aperture 12 of the second apparatus part.

In case the fastener 3 is applied in an vacuum system, it may combine two main advantages. Firstly, the fastener 3 may provide for a well controlled fastening of the apparatus parts, leading to a durable fastening of those parts 1, 2. Secondly, the fastener 3 may avoid dead volumes significantly. Both advantages may provide for a better system performance, cost reduction, lower downtimes and the like.

FIG. 8 shows a second embodiment of a fastener 3' according to the invention. The second embodiment differs from the first embodiment of FIGS. 2–6, in that the helical spring part 4' has a left hand -or counter-clockwise- turn, viewed downwardly from the head 6' of the fastener 3'. Also, preferably, the turn of the helical part 4' is opposite to the counter-clockwise fastening direction of the fastener 3', to provide a self-locking function during assembly. In that case, the direction of the pitch of the outer screw thread (not shown in FIG. 8) of the fastener 3' has a clockwise turn. The fastener 3' according the second embodiment can be turned in a 'normal' clockwise direction during assembly.

Figure 9:
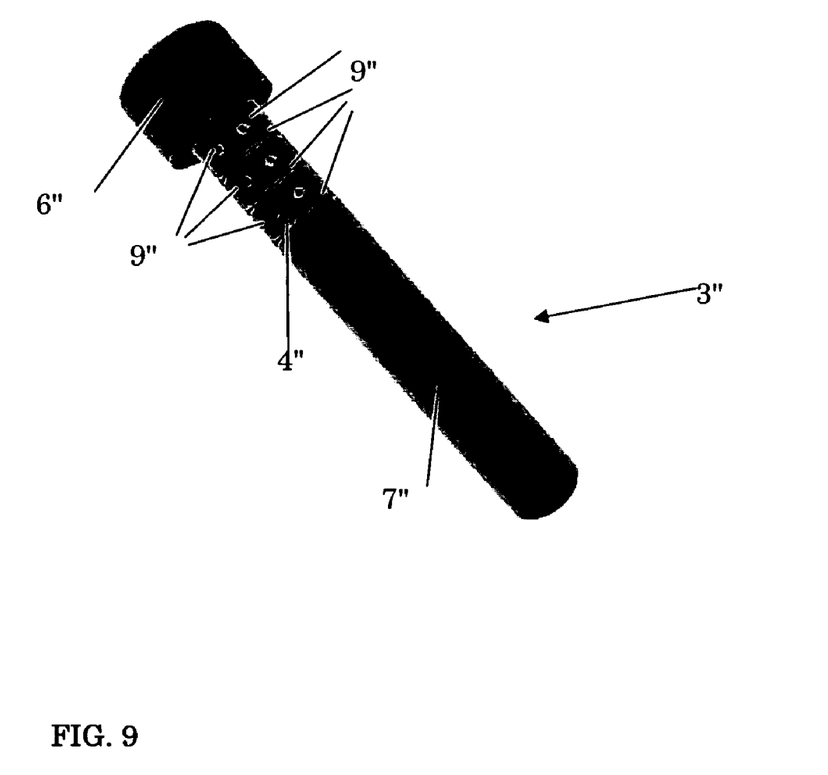
FIG. 9 is a perspective view of a fastener according to an embodiment.
Figure 10:
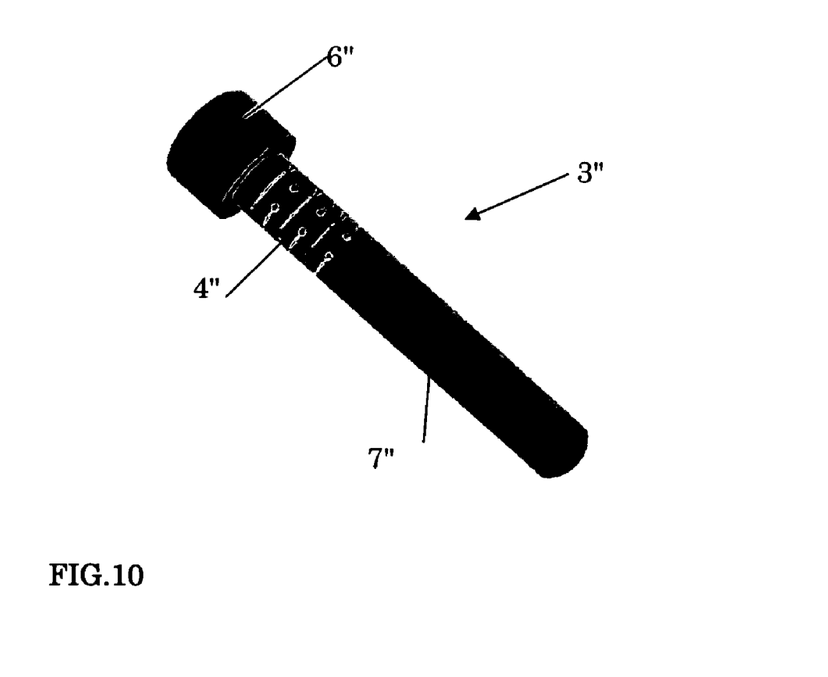
FIG. 10 is a view similar to FIG. 9 in which the fastener has been rotated over 90°.
Figure 11:
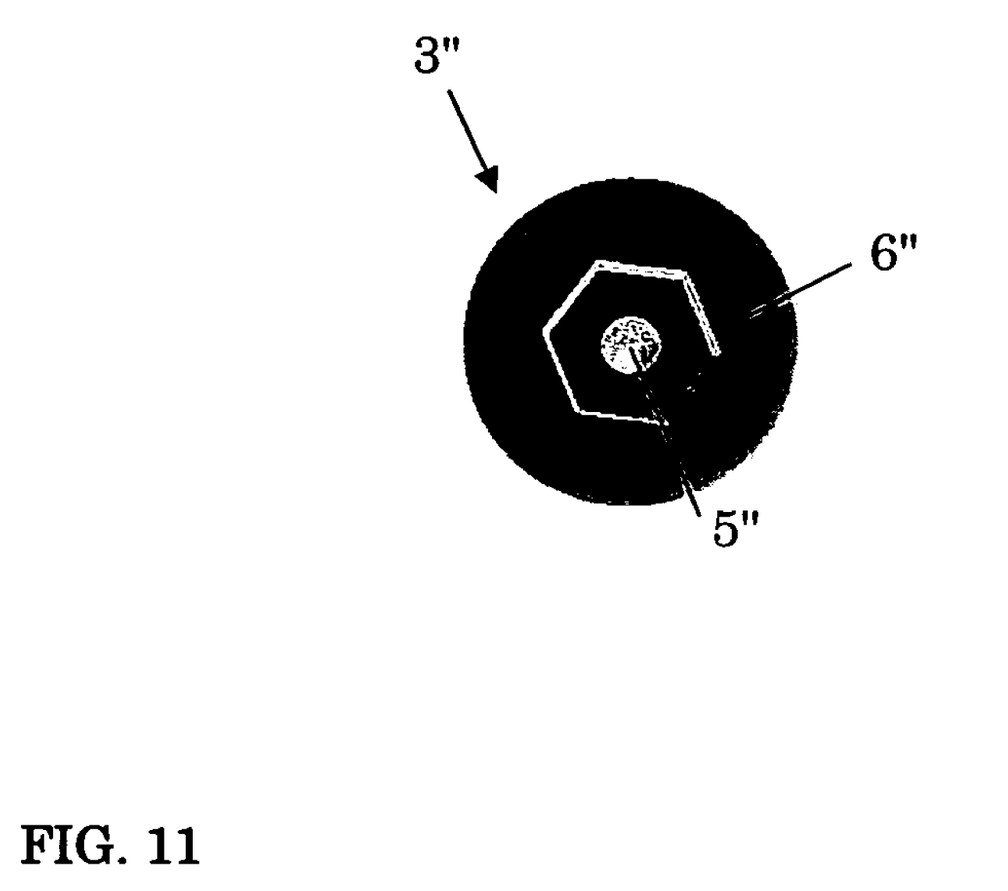
FIG. 11 is a top view of the fastener of FIG. 9.

FIG. 9 is a perspective view of a third embodiment of a fastener according to the invention. FIG. 10 is a view similar to FIG. 9, wherein the third embodiment has been rotated about 90°. A top view of the third embodiment is shown in FIG. 11. The third embodiment 3" differs from the first and second embodiment, in that the integral spring part 4" is not a helical spring. The third embodiment includes a fastener 3", wherein the integrated spring 4" includes a plurality of separate slits 9" extending between an outer circumference of the shaft 7" of the fastener 3" and an internal hole, in the present embodiment an axial through-hole 5", thereof. A number of the slits 9" are spaced apart, viewed in the axial direction of the shaft 7" of the fastener 3". Particularly, a number of the slits 9" are spaced apart, viewed in an circumferential direction of the shaft of the fastener 3". Also, each slit 9" overlaps at least one circumferential end of each axially nearest slit 9", viewed in axial direction of the fastener shaft 7". In the present embodiment, these circumferential ends each include a substantially circular bore extending radially into the fastener 3". All of the slits 9" together overlap each other at least once over the whole circumference of the fastener shaft 7", viewed in axial direction of the fastener shaft 7". Clearly, therefore, the integrated spring 4" is provided by a number of such slit shaped apertures 9" extending between the outer circumference of the fastener 3" and the axial through-hole 5" thereof. In the present embodiment, each slit 9" extends substantially perpendicular to the central axis of the fastener 3". The slits 9" may have various shapes, and can also extend in different directions, for providing a certain desired elasticity to the fastener.

Each fastener 3, 3', 3" as such may be manufactured in various ways. According to an embodiment, the manufacturing may involve a method for manufacturing a screw, bolt or stud, having a shaft 7, 7', 7" and a head 6, 6', 6", wherein at least one cut-out is machined into the shaft for providing an integral spring part 4, 4', 4". For providing the first or second embodiment, of FIGS. 2–8, for example, the cut-out is a helical cut-out 9, 9', and the spring part 4, 4' is a helical spring part. For manufacturing the third embodiment, a number of slits 9" are cut out of the shaft 7" of the fastener.

Part of the shaft 7 is provided with the screw thread 10. Also, each of the cut-outs 9, 9', 9" preferably extends between the head 6, 6', 6" and the screw thread 10. For example, each cut-out may be made after the screw thread has been provided in the shaft, and/or during the machining of the cut-out. Also, each cut-out may be machined in a part of the shaft which does not have the screw thread 10, for example, the part that provides a free length of the fastener. The direction of the pitch of the helical part may be made opposite to the fastening direction of the fastener, in case the fastener is being provided with such a helical part. The axial hole 5, 5', 5" may be drilled into the shaft of the fastener 3, 3', 3".

One or more fasteners 3, 3', 3" may be used to one or more parts of an apparatus, for example, a lithography apparatus and/or a vacuum apparatus. Also, one or more fasteners 3 3', 3" may be used to fasten one or more parts of an apparatus which is used in a lithographic device manufacturing method.

Each fastener may include one or more integrated springs, for example, at least one or two helical parts.

Furthermore, one or more of the integrated springs may be constructed and formed in various ways, for example, as a helical part, including a helical cut-out, or in an other way. One of more of the integrated springs may also be provided, for example, by a number of slits or apertures extending between the outer circumference of the fastener and the axial hole thereof, and/or in a different form and arrangement.

While specific embodiments of the invention have been described above, it will be appreciated that the invention may be practiced otherwise than as described. The description is not intended to limit the invention.

What is claimed is:

1. A lithographic apparatus comprising:
   an illumination system for conditioning a beam of radiation;
   a support structure for supporting a patterning device, the patterning device serving to impart the projection beam with a pattern in its cross-section;
   a substrate table for holding a substrate;
   a projection system for projecting the patterned beam onto a target portion of the substrate; and
   at least one fastener for fastening a first part of the apparatus to a second part of the apparatus, the fastener comprising an axial hole, and at least one integrated spring, the integrated spring comprising one or more openings extending at least radically from said axial hole to the outer surface of the fastener.

2. An apparatus according to claim 1, wherein said spring is a helical part of the fastener.

3. An apparatus according to claim 2, wherein the fastener further comprises a screw thread, and the direction of a pitch of said helical part is opposite to the direction of a pitch of the screw thread, for providing a self-locking function during assembly.

4. An apparatus according to claim 2, wherein the fastener further comprises a screw thread, and direction of a pitch of said helical part is the same as the direction of a pitch of the screw thread.

5. An apparatus according to claim 2, wherein the fastener further comprises a screw threaded shaft part and a head part, wherein said spring extends between said screw threaded shaft part and said head part.

6. An apparatus according to claim 1, further comprising a tightening element which is arranged to be inserted in said axial hole of the fastener, during tightening of the fastener.

7. An apparatus according to claim 1, wherein the axial hole of the fastener is in fluid communication with a vacuum environment of the apparatus after assembly.

8. An Apparatus according to claim 1, wherein the first apparatus part is located in a vacuum environment of the apparatus.

9. An apparatus according to claim 1, wherein the first apparatus part is an optical element, mirror, lens, wafer stage part, mask stage part, detector part or mounting frame of the apparatus.

10. An apparatus according to claim 9, wherein the second apparatus part is a frame part, wall part or base part of the apparatus.

11. A lithographic apparatus comprising:
    an illumination system for conditioning a beam of radiation;
    a support structure for supporting a patterning device, the patterning device serving to impart the projection beam with a pattern in its cross-section;
    a substrate table for holding a substrate;
    a projection system for projecting the patterned beam onto a target portion of the substrate; and
    at least one fastener for fastening a first part of the apparatus to a second part of the apparatus, the fastener comprising an internal hole and at least one integrated spring provided by a plurality of apertures extending between an outer circumference of the fastener and the internal hole.

12. An apparatus according to claim 11, wherein said spring is a helical part of the fastener.

13. An apparatus according to claim 12, wherein the fastener further comprises a screw thread, and the direction of a pitch of said helical part is opposite to the direction of a pitch of the screw thread, for providing a self-locking function during assembly.

14. An apparatus according to claim 12, wherein the fastener further comprises a screw thread, and direction of a pitch of said helical part is the same as the direction of a pitch of the screw thread.

15. An apparatus according to claim 12, wherein the fastener further comprises a screw threaded shaft part and a head part, wherein said spring extends between said screw threaded shaft part and said head part.

16. An apparatus according to claim 11, wherein the internal hole is an axial hole.

17. An apparatus according to claim 16, further comprising a tightening element which is arranged to be inserted in said axial hole of the fastener, during tightening of the fastener.

18. An apparatus according to claim 16, wherein the axial hole of the fastener is in fluid communication with a vacuum environment of the apparatus after assembly.

19. Apparatus according to claim 11, wherein the first apparatus part is located in a vacuum environment of the apparatus.

20. An apparatus according to claim 11, wherein the first apparatus part is an optical element, mirror, lens, wafer stage part, mask stage part, detector part or mounting frame of the apparatus.

21. An apparatus according to claim 20, wherein the second apparatus part is a frame part, wall part or base part of the apparatus.

22. A lithographic apparatus comprising:
an illumination system for conditioning a beam of radiation;
a support structure for supporting a patterning device, the patterning device serving to impart the projection beam with a pattern in its cross-section;
a substrate table for holding a substrate;
a projection system for projecting the patterned beam onto a target portion of the substrate; and
at least one fastener for fastening a first part of the apparatus to a second part of the apparatus, the fastener comprising a shaft, an internal hole, and at least one integrated spring, the integrated spring comprising a plurality of separate slits extending between an outer circumference of the shaft and the internal hole, a number of said slits being spaced apart, when viewed in an axial direction of the shaft.

23. An apparatus according to claim 22, wherein a number of said slits are spaced apart, when viewed in an circumferential direction of the shaft.

24. An apparatus according to claim 22, wherein each slit overlaps at least one circumferential end of each axially nearest slit, when viewed in the axial direction of the shaft.

25. An apparatus according to claim 22, wherein all of the slits together overlap each other at least once over the whole circumference of the shaft, viewed in the axial direction of the shaft.

26. An apparatus according to claim 22, wherein said spring is a helical part of the fastener.

27. An apparatus according to claim 26, wherein the fastener further comprises a screw thread, and the direction of a pitch of said helical part is opposite to the direction of a pitch of the screw thread, for providing a self-locking function during assembly.

28. An apparatus according to claim 26, wherein the fastener further comprises a screw thread, and direction of a pitch of said helical part is the same as the direction of a pitch of the screw thread.

29. An apparatus according to claim 22, wherein the fastener further comprises a head part, and the shaft comprises a screw threaded shaft part, wherein said spring extends between said screw threaded shaft part and said head part.

30. An apparatus according to claim 22, further comprising a tightening element which is arranged to be inserted in said internal hole of the fastener, during tightening of the fastener.

31. An apparatus according to claim 22, wherein the internal hole of the fastener is in fluid communication with a vacuum environment of the apparatus after assembly.

32. An apparatus according to claim 22, wherein the first apparatus part is located in a vacuum environment of the apparatus.

33. An apparatus according to claim 22, wherein the first apparatus part is an optical element, mirror, lens, wafer stage part, mask stage part, detector part or mounting frame of the apparatus.

34. An apparatus according to claim 33, wherein the second apparatus part is a frame part, wall part or base part of the apparatus.

* * * * *